United States Patent [19]

Fuse et al.

[11] Patent Number: 4,764,483

[45] Date of Patent: Aug. 16, 1988

[54] METHOD FOR BURYING A STEP IN A SEMICONDUCTOR SUBSTRATE

[75] Inventors: Genshu Fuse, Hirakata; Kenji Tateiwa, Neyagawa; Ichiro Nakao, Kadoma; Hideaki Shimoda, Moriguchi, all of Japan

[73] Assignee: Matsushita Electric Industrial Co., Ltd., Kadoma, Japan

[21] Appl. No.: 82,313

[22] Filed: Aug. 6, 1987

[30] Foreign Application Priority Data

Sep. 19, 1986 [JP] Japan .................. 61-223058

[51] Int. Cl.$^4$ ........................................... H01L 21/76
[52] U.S. Cl. ........................ 437/67; 437/228; 437/238; 437/229; 156/661.1
[58] Field of Search .............. 437/67, 68, 63, 61, 437/978, 228, 229, 235, 238; 156/653, 657, 659.1, 661.1; 357/49, 50

[56] References Cited

U.S. PATENT DOCUMENTS

| | | | |
|---|---|---|---|
| 3,976,524 | 8/1976 | Feng | 437/228 |
| 4,274,909 | 6/1981 | Venkataraman | 437/39 |
| 4,389,281 | 6/1983 | Anantha et al. | 156/661.1 |
| 4,402,851 | 10/1983 | Kurasawa et al. | 156/653 |
| 4,505,025 | 3/1985 | Kurasawa et al. | 437/228 |
| 4,506,434 | 5/1985 | Ogawa et al. | 437/67 |
| 4,662,986 | 5/1987 | Lim | 156/653 |

FOREIGN PATENT DOCUMENTS

| | | | |
|---|---|---|---|
| 0204135 | 12/1982 | Japan | 437/67 |
| 0129438 | 7/1984 | Japan | 437/34 |
| 0167030 | 9/1984 | Japan | 437/59 |

Primary Examiner—Brian E. Hearn
Assistant Examiner—Kevin McAndrews
Attorney, Agent, or Firm—Wenderoth, Lind & Ponack

[57] ABSTRACT

Disclosed is a method for burying a step in a semiconductor substrate in which (1) SiO$_2$ layer is formed on a lower part of the step, (2) photoresist layer with equal thickness to the height of the step on the SiO$_2$ layer at a portion corresponding to the lower part of the step, (3) sputter-SiO$_2$ layer is formed by sputtering on the photoresist layer and SiO$_2$ layer, (4) another photoresist layer is formed on the sputter-SiO$_2$ layer, (5) the another photoresist layer and sputter-SiO$_2$ layer are removed, and (6) the SiO$_2$ layer and photoresist layer are removed. By this method, semiconductor substrate with flatness of within 50 nm in a 6-inch wafer can be obtained.

8 Claims, 6 Drawing Sheets

FIG. IA
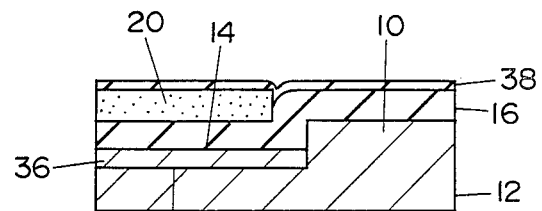
FIG. IB
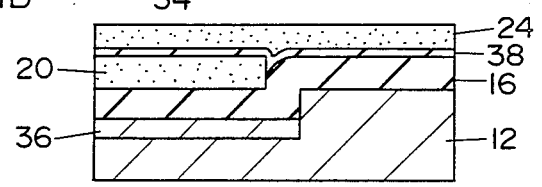
FIG. IC
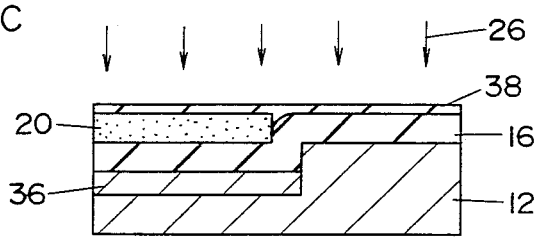
FIG. ID
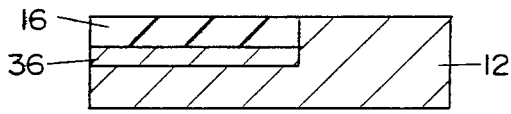
FIG. IE
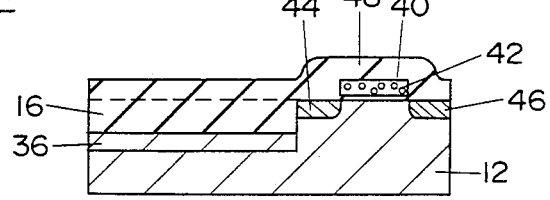

METHOD FOR BURYING A STEP IN A SEMICONDUCTOR SUBSTRATE

BACKGROUND OF THE INVENTION

This invention relates to a method for burying a step in a semiconductor substrate.

In forming a device-isolation-portion of an LSI, it is a conventional method to fill dielectric material or the like in a recess so as to bury the recess by the etch-back process which makes use of flat coating by spin coating of resist. Trench isolation which is used in isolation between devices of high-density LSI was reported by Kurosawa et al. at the IEDM in 1981 [IEDM (International Electron Device Meeting) Tech. Dig., 384 (1981)]. The method of burying the isolation recess and field region disclosed in this report is described below while referring to FIG. 3.

A dielectric material 16 ($SiO_2$ deposit film), which is used for burying a lower part 14 of a step part 10 in a semiconductor substrate 12 in which the step part 10 is formed, is deposited, and a photoresist film 20 is formed by photolithography nearly at the same height as a higher part 18 of the step part 10 in the lower part 14 (FIG. 3A). A trench 22 is left over only between the higher part 18 and lower part 14. In the step shown in FIG. 3B, an organic film 24 is flatly applied by spin coating process from above, and the trench 22 is buried and flattened by making use of the nature of coating of organic film. In the step shown in FIG. 3C, only the organic film 24 is etched by using plasma beam 26 until the dielectric film 16 on the higher part 18 is exposed. Afterwards, in the next step shown in FIG. 3D, the photoresist film 20 and dielectric film 16 are etched by plasma beam 28 nearly to the surface of the higher part 18 of Si substrate 12 nearly in the same etching speed. As a result, the surface is flattened almost completely. Thereafter, by making devices in the semiconductor substrate 12 with the higher part 18 exposed, an LSI circuit is composed.

When the LSI is thus formed, the following three problems may occur. These problems are explained below by referring to FIG. 4. As shown in FIG. 4A, when applying the organic film 24 by spin coating, a difference is caused in the flow resistance on the photoresist film 20 and dielectric film 16, and a discrepancy in thickness occurs near the boundary, and the step part 10 of substrate 12 is convex, and if this convex part principal plane is broad, an extreme unevenness occurs, which makes it extremely difficult to flatten completely. In FIG. 4B, since the organic film 24 applied on the photoresist film 20 contains solvent, the photoresist film 20 is dissolved, and uneven state is caused, too. Finally, the problem in the step of etching the organic film 24 in the process of FIG. 3C is given in FIG. 4C. Usually, the end point of etching is detected by emission of light from the principal component to make up the material to be etched, and in the process shown in FIG. 3C, the atoms to compose the organic film 24 and photoresist film 20 are carbons, and since carbons pop out when ending, it is impossible to detect the end point.

SUMMARY OF THE INVENTION

This invention is made in the light of the above problems, and is to solve the above three problems only by adding one process to the prior art.

The method of this invention comprises, at least, a step of forming a recess on a semiconductor substrate having a step, a step of depositing a first film to be buried in the recess, a step of forming a photoresist pattern of nearly equal film thickness as the step in the majority of the recess by photolithography, a step of depositing a thin film (a second film) by sputter-deposition, plasma CVD or other method being almost free from deformation of photoresist pattern, a step of forming nearly flatly a third film by coating according to the spin coating method, a step of etching the third film and second film from above, and a step of etching the first film and photoresist film stimultaneously. That is, in the state shown in FIG. 3A, a thin film is deposited at low temperature (photoresist heat resistance temperature or lower) of sputter-deposition or plasma CVD. By applying an organic film thereon, it is flattened. Further flattening is achieved by the steps shown in FIGS. 3C and 3D.

According to the present invention as described herein, the following benefits, among others, are obtained. Concerning the first problem (FIG. 4A), a uniform coat state is realized because the photoresist and device forming convex part are coated with a same film by the low temperature deposition thin film. At the same time, dissolution does not occur because direct contact between the organic coat film and photoresist is not present. Besides, when etching the organic thin film, since there is no surface of photoresist film at the end of etching, the etching end point can be easily monitored.

While the novel features of the invention are set forth in the appended claims, the invention, both as to organization and content, will be better understood and appreciated, along with the other objects and features thereof, from the following detailed description taken in conjunction with the drawings.

BRIEF DESCRIPTION OF THE DRAWINGS

FIG. 1A to FIG. 1E are sectional views to show the method for burying a step of semiconductor substrate in an embodiment of this invention;

DETAILED DESCRIPTION OF THE INVENTION

Figure 2:
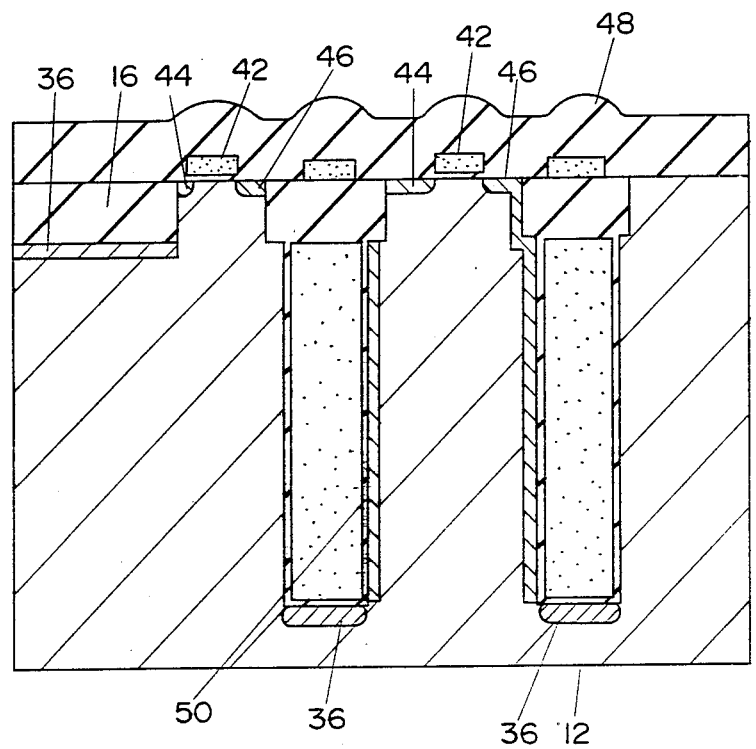
FIG. 2 is a sectional view of a dynamic RAM using this invetion.
Figure 3A:
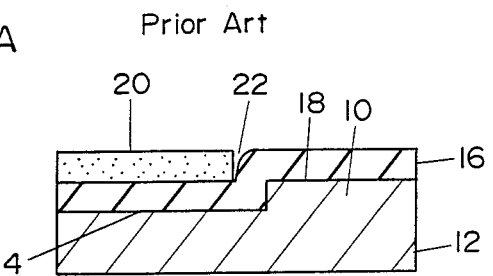
FIG. 3A to FIG. 3D are sectional views in an example of conventional process.
Figure 3B:
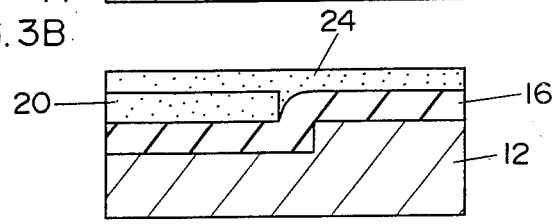
Figure 3C:
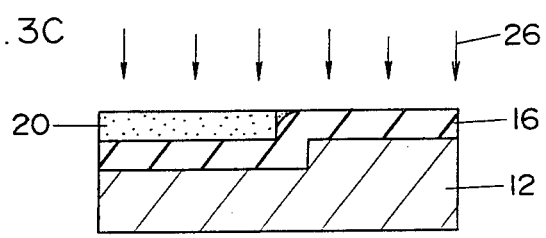
Figure 3D:
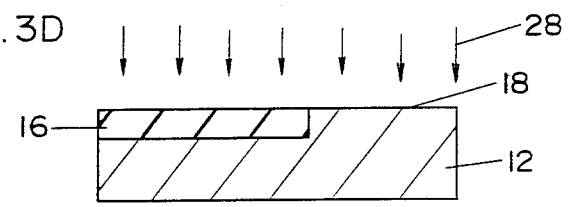
Figure 4A:
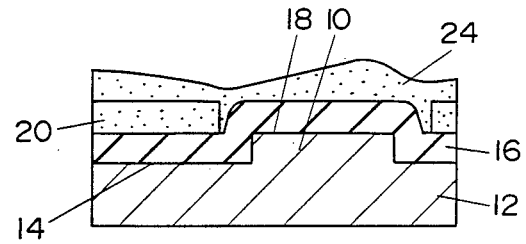
FIG. 4A to FIG. 4C are sectional views to explain three problems of the prior art.
Figure 4B:
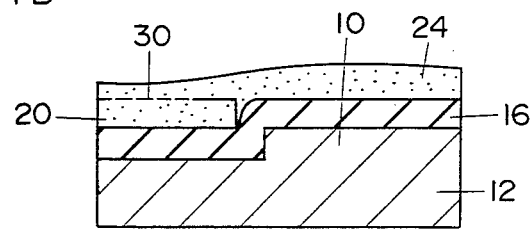
Figure 4C:
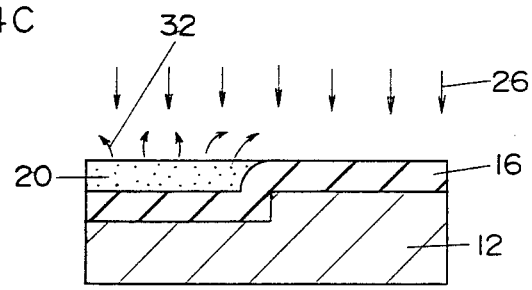

Referring now to FIG. 1, one of the embodiments of this invention is described below with reference to FIG. 1. This embodiment may be summarized as follows. In the step shown in FIG. 1A, semiconductor substrate 12 was ditched by 500 nm to form step 10 with recess 34 by etching from above a p-type silicon (100) substrate 12, and in this recess 34, a p+ region was formed as channel stopper 36. On this region 36, an oxide film 16 was deposited by 500 nm on lower part 14 and upper part 18 of step 10 by reduced pressure CVD process as shown in FIG. 1A. Afterwards, by photolithography, only on the broad lower part 14, a photoresist pattern was formed in a film thickness of 500 nm which is the same as the height of step 10 by photoresist 20. After depositing a sputter-SiO$_2$ film 38 by 10 nm by sputtering technique, a photoresist film 24 was deposited in a thickness of 1.2 μm on sputter-SiO$_2$ film., 38 as shown in FIG. 1B. In this case, since the film 24 is nearly flat and uniform in property, it is possible to form very uniformly without causing undulations or intermixing. In the step shown in FIG. 1C, photoresist film 24 was etched from above by O$_2$ plasma 26 until the surface of sputter-SiO$_2$ film 38 was exposed. At this time, by observing the plasma light emission of photoresist, it is possible to etch accurately up to the surface of SiO$_2$ film 38. The SiO$_2$ film 38 and resist film 20 were etched nearly at the same etch-rate conditions, i.e., by CHF$_3$+O$_2$ plasma, and the surface of the Si substrate 12 was exposed (FIG. 1D). In the step shown in FIG. 1E, MOS transistor 40 is formed in the device forming part, in which numeral 42 is a gate electrode of the same transistor 40, and 44, 46 are n+ diffusion layers to become source and drain, respectively. The MOS transistor 40 is coated with SiO$_2$ film 48. As for the sputter-SiO$_2$ film 38, the effect is the same as far as a low temperature deposition film as in plasma method is used. The same effect will be achieved by using other films than SiO$_2$, such as Si$_3$N$_4$ and poly-Si film.

Figure 5A:
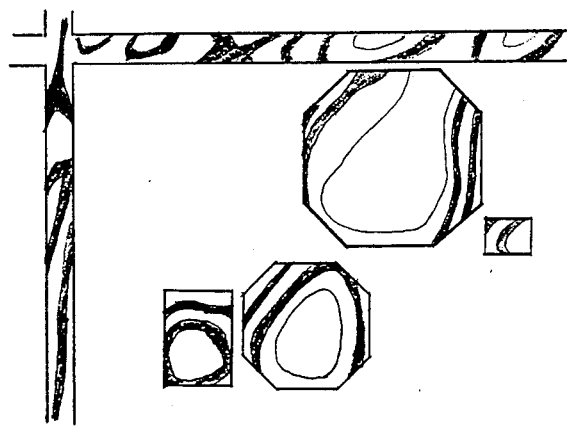
FIGS. 5A and 5B are plane views showing a surface of semiconductor substrate in the prior art and in this invention respectively.
Figure 5B:
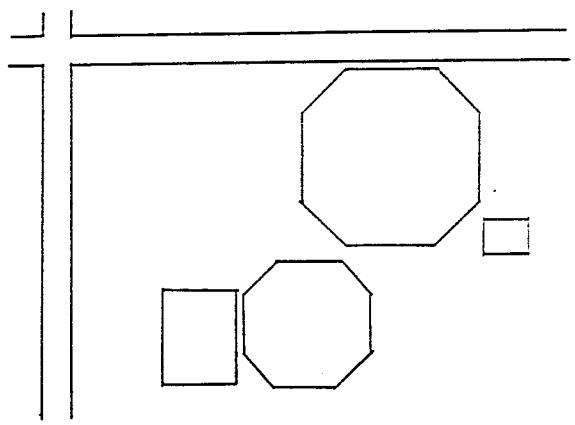
Figure 6A:
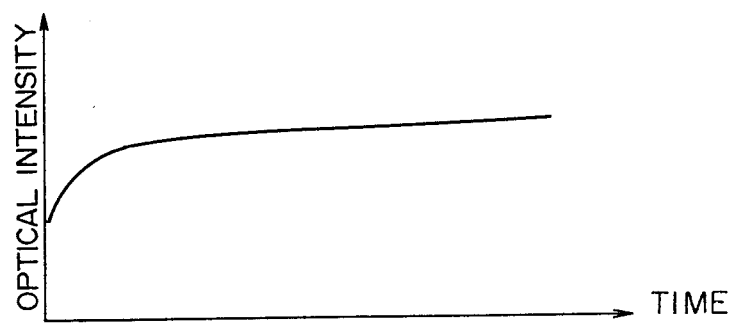
FIGS. 6A and 6B show characteristics to show the transition of photoresist emission intensity in the prior art and in this invention, respectively.
Figure 6B:
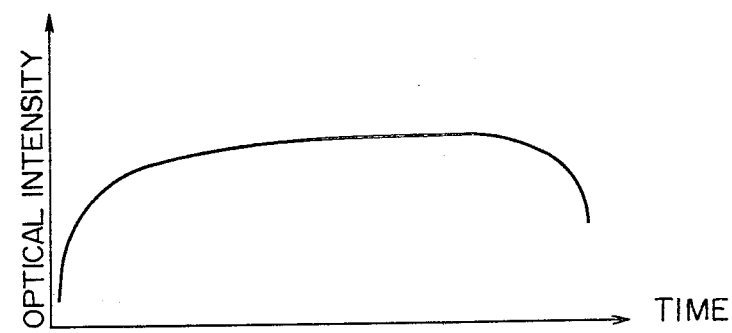

The surface of the semiconductor substrate formed by employing the above method is shown in FIG. 5. These are views showing an intermediate step between the step of FIG. 1C and the step of FIG. 1D. FIG. 5A shows conventional process with wave-shaped unevenness in the device-forming area 15 and isolation area 16. In FIG. 5B showing this invention process, in contrast, uneven portion is not found in the device-forming area 17 and isolation area 18. FIG. 6 shows characteristics with monitoring the plasma emission intensity of carbon at the time of etching of the photoresist 4 in the step of FIG. 1C. The axis of abscissa denotes the time. FIG. 6A shows the light emission in the conventional process, and the optical intensity is not changed even when the photoresist 4 is removed. FIG. 6B shows the process by this invention, in which the optical intensity is lowered when the photoresist film 4 is nearly removed.

The substrate formed by this method had a flatness of within 50 nm in a six-inch wafer, but when formed by the conventional method, the flatness was over 250 nm only within the device-forming area. Thus, by addition of only one step, a very significant effect was obtained.

An example of sectional view of a high density dynamic RAM cell possessing thus formed trench capacitor 50 is shown in FIG. 2. Usually, the capacitor is formed beneath the isolation area which is narrow in width. An isolation of a broad width may be also present in part of the vicinity of RAM cell.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A method for burying a step in a semiconductor substrate comprising:
   forming a first film on a lower part and upper part of said step;
   forming a photoresist layer with substantially equal thickness to the height of said step on said first film at a portion corresponding to said lower part of said step;
   forming a second film on said photoresist layer and said first film;
   forming a third film substantially flatly on said second film;
   removing said third and second films by etching; and
   removing said first film and photoresist layer.

2. A method of claim 1, wherein said first film is an oxide layer, second film is a thin oxide layer and third film is a photoresist layer.

3. A method of claim 2, wherein said first and second films are SiO$_2$ layers.

4. A method of claim 2, wherein said second film is formed by a sputtering or plasma deposition technique.

5. A method of claim 1, further comprising a step of forming a channel stopper region in said lower part of said step.

6. A method of claim 1, further comprising a step of forming a semiconductor device in said upper part of said step.

7. A method for burying a step in a semiconductor substrate comprising:
   forming a SiO$_2$ layer on a lower part and upper part of said step;
   forming a first photoresist layer with substantially equal thickness to the height of said step on said SiO$_2$ layer at a portion corresponding to said lower part of said step;
   forming a sputter-SiO$_2$ layer on said photoresist pattern and said SiO$_2$ layer by sputtering technique;
   forming a second photoresist layer substantially flatly on said sputter-SiO$_2$ layer;
   removing said second photoresist layer and sputter-SiO$_2$ layer by etching; and
   removing said SiO$_2$ layer and first photoresist layer.

8. A method for burying a step in a semiconductor substrate comprising:
   forming a channel stopper region in a lower part of said step;
   forming a first film on said lower part and upper part of said step;
   forming a photoresist layer with substantially equal thickness to the height of said step on said first film at a portion corresponding to said lower part of said step;
   forming a second film on said photoresist pattern and said first film;
   forming a third film substantially flatly on said second film;
   removing said third and second films by etching;
   removing said first film and photoresist layer; and
   forming a semiconductor device in said upper part of said step.

* * * * *